United States Patent [19]

Linder et al.

[11] Patent Number: 4,728,931

[45] Date of Patent: Mar. 1, 1988

[54] CHARGE REDISTRIBUTION CAPACITANCE DETECTION APPARATUS

[75] Inventors: William J. Linder, Minneapolis; James D. Reinke, New Hope, both of Minn.

[73] Assignee: Honeywell Inc., Minneapolis, Minn.

[21] Appl. No.: 890,215

[22] Filed: Jul. 25, 1986

[51] Int. Cl.[4] .................................................. G06F 3/02
[52] U.S. Cl. ............................. 340/365 C; 340/365 S; 324/60 CD; 307/116
[58] Field of Search ............ 340/365 C, 365 S, 365 R; 324/60 CD; 178/17 C; 307/116; 200/DIG. 1

[56] References Cited

U.S. PATENT DOCUMENTS

| | | | |
|---|---|---|---|
| 3,750,113 | 7/1973 | Cencel | 340/365 C |
| 3,931,610 | 1/1976 | Marin et al. | 340/365 C |
| 4,157,539 | 6/1979 | Hunts et al. | |
| 4,163,222 | 7/1979 | Gove | |
| 4,175,239 | 11/1979 | Sandler | |
| 4,211,915 | 7/1980 | Miller et al. | |
| 4,266,144 | 5/1981 | Bristol | |
| 4,305,135 | 12/1981 | Dahl et al. | 340/365 C |
| 4,322,977 | 4/1982 | Sell et al. | |
| 4,405,917 | 9/1983 | Chai | 340/365 C |
| 4,405,918 | 9/1983 | Wall et al. | |

OTHER PUBLICATIONS

"Grounded Capacitive Sensing Technique", by H. S. Hoffman, Jr.; IBM Tech. Discl. Bul. 21; vol. 22, No. 4; 9/79.

"A MOS LSE Cap. Keyboard Interface Chip", Kate et al., IEEE Journal, vol. SC 13, No. 5, Oct. 1978; also see 1978 IEEE International Solid-State Circuits Conf.; Friday, Feb. 17, 1978.

Primary Examiner—John W. Caldwell, Sr.
Assistant Examiner—Tyrone Queen
Attorney, Agent, or Firm—Charles L. Rubow

[57] ABSTRACT

A charge redistribution capacitance detector is disclosed for detecting whether the capacitance of a variable capacitor is smaller or larger than that of a reference capacitor. First plates of the variable and reference capacitors are connected to a sense node, and a switching device responsive to a clock signal periodically impresses a reference voltage on the sense node during one phase of the clock signal and allows the sense node to electrically float during the alternate phase of the clock signal. Second plates of the sense and reference capacitors are alternately charged and discharged by equal voltage differences in opposite senses during successive clock phases. The voltage on the first plates of the capacitors changes in a sense dependent on the relative capacitance values of the capacitors and is compared with the reference voltage by a comparator which produces a corresponding detector output.

13 Claims, 5 Drawing Figures

CHARGE REDISTRIBUTION CAPACITANCE DETECTION APPARATUS

BACKGROUND OF THE INVENTION

The invention disclosed herein relates generally to apparatus for detecting the states of capacitive sensing devices such as key actuated variable capacitors, and more particularly to circuitry for reliably determining the states of variable capacitors in a plurality of such capacitors in which the capacitance change of any capacitor may be masked by the effective shunt capacitance of the other capacitors and other circuit elements.

Electronic keyboards have long comprised a primary form of input device for information handling and data processing systems. Capacitive keyboards are well known in the field of data input devices. They provide certain inherent advantages over electrical contact keyboards. These advantages particularly include mechanical simplicity, long life and absence of electrical signal problems caused by contact bounce and corrosion.

In order to reduce the cost and complexity of detection circuitry used with capacitive keyboards and in order to reduce the number of conductors necessary to connect such keyboards with external detection circuitry, it is known to provide for sequential scanning of the key actuated capacitors to determine key status. This may be accomplished by means of a matrix of row and column conductors, each key actuated capacitor being connected between unique pair of conductors comprising one row and one column conductor. A drive signal may be sequentially impressed on conductors in one set of conductors while the conductors in the other set are sequentially addressed to detect signals coupled thereto.

However, as set forth in numerous publications, including U.S. Pat. No. 3,750,113 issued to J. Cencel on July 31, 1973, scanned capacitive keyboards suffer from another problem which is particularly significant in capacitively coupled systems. This problem stems from the fact that there is inherent capacitive coupling between every pair of elements in a keyboard. Thus, in a typical capacitive keyboard having a matrix of conductors including drive signal and sense signal conductors, a signal on any conductor will normally appear to some extent on every other conductor. Obviously, this phenomenon complicates the task of detecting which of an array of variable capacitors between pairs of conductors in the matrix is actuated.

As noted in the above identified patent, a variety of techniques have been employed in attempts to minimize problems caused by stray capacitive coupling. These techniques include the use of ground lines interleaved between the drive and/or sense conductors, ground planes and various forms of shielding. In addition, various electronic signal detection, verification and processing techniques have been employed to improve the reliability of detecting and distinguishing valid key actuation signals from signals caused by stray coupling. Some representative techniques are disclosed in U.S. Pat. No. 3,931,610 issued to R. Marin, et al on Jan. 6, 1976, U.S. Pat. No. 4,163,222 issued to D. Gove on July 31, 1979, and U.S. Pat. No. 4,211,915 issued to D. Miller, et al on July 8, 1980.

It is also known to maintain a reference potential on all conductors except for individual conductors while they are being addressed to effectively eliminate cross talk and interference in a capacitive keyboard in which an array of capacitors is sequentially scanned. This technique is shown in Katz, et al, "A MOS LSI Capacitive Keyboard Interface Chip", IEEE Journal of Solid-State Circuits, Vol. SC-13, No. 5, pages 561–565, (October 1978), and U.S. Pat. No. 4,405,917 issued to T. Chai on Sept. 20, 1983.

The foregoing techniques are useful in reducing the effects of unintentional capacitive coupling through elements other than capacitors in a single row or column. However, a problem continues to exist in detecting a valid key actuation where the key is one of a plurality of actuated keys in the same row or column, as might occur if a key is actuated before previously actuated keys are released. More specifically, the capacitors associated with keys other than the key being addressed act as shunt capacitors between the sense conductor and ground or other reference potential. The change in voltage on the sense conductor due to actuation of a key is equal to the drive voltage times the capacitance of the capacitor associated with the key divided by the sum of the shunt capacitance and the key associated capacitance. If a number of keys other than the key of interest are actuated or a large shunt capacitance is otherwise present, the change in sensed voltage becomes small. This phenomenon is noted in previously identified U.S. Pat. No. 3,750,113 in which an amplifier configured for substantially unity gain, thus operating in a current amplifier mode, is employed to reduce the difficulties in correctly detecting key actuation.

The sensed voltage is typically compared with a fixed threshold reference to determine whether there is sufficient change to indicate actuation of a key. U.S. Pat. Nos. 4,175,239 issued to L. Sandler on Nov. 20, 1979 and 4,266,144 issued to R. Bristol on May 5, 1981 illustrate representative capacitive apparatus in which sensed voltages are compared with constant threshold or reference voltages. As the change in sensed voltage becomes small due to the simultaneous actuation of an increasing number of keys, reliable detection of key actuations becomes increasingly difficult. Techniques for overcoming this problem include increasing the drive voltage and/or maintaining tighter control over parasitic capacitances. Increasing the drive voltage is undesirable because it leads to increased power consumption and increased manufacturing costs. In general, any requirement to maintain tighter control over parasitic capacitances also results in increased manufacturing costs, and is, therefore, undesirable.

One recent approach to further minimizing or avoiding many of the foregoing difficulties has involved a charge redistribution arrangement coupled with a specialized comparator. The comparator output is indicative of minute voltage change on a sense node resulting from charging in opposite senses of a sample or sense (key actuated) capacitor and a reference capacitor connected to the node. The polarity of the comparator output depends on the capacitance of the sample or sense capacitor relative to the capacitance of the reference capacitor.

In one operable implementation, the comparator was formed of a pair of cross coupled inverters which effectively established an adaptive reference against which key state dependent signals were sensed. However, this approach utilized large inverter to provide the required low impedance. Due to this and other design characteristics, the current demand in the static mode was higher than desired. Power supply variations also tended to change the inverter trip point. In addition, since the inverter and the cabling carrying the sense node signal were not referenced to ground, the design was subject to higher than desired system noise.

The present invention minimizes or avoids these problems by utilizing system ground as a reference voltage, and by employing a more conventional comparator. Partially as a result, the circuit is physically smaller, requires less electric current, and has higher noise immunity. Finally, the circuit is well suited for fabrication with standard CMOS integrated circuit designs which provide for low power consumption and low cost.

SUMMARY OF THE INVENTION

The present invention is a capacitance detector for reliably detecting the state of a capacitor whose capacitance is variable between minimum and maximum values, and whose capacitance changes may be masked by substantial shunt or parasitic capacitances. The apparatus basically comprises a comparator having its input terminal connected through a switch to a sense node to which are connected the first plates of a sense capacitor and a reference capacitor whose capacitance is between the minimum and maximum capacitance values of the sense capacitor. The switch is controlled by a clock which also controls a signal generator which, during a first interval of each clock cycle, impresses a reference voltage on the second plate of the variable capacitor and a drive voltage different from the reference voltage on the second plate of the reference capacitor. During alternate intervals of the clock cycle, the voltages on the second plates of the capacitors are reversed. The switch operates to electrically isolate the first plates of the capacitors from the comparator input during the first time intervals and to electrically connect the first plates to the comparator input during the second time intervals. The comparator input and the sense node are precharged to ground potential during the first time intervals to provide a reference against which the voltage on the node resulting from charge redistribution during the second time intervals can be compared.

The comparator is preferably of an auto zeroing type. The output of the comparator may be supplied through a latching circuit to preserve the output produced during a second time interval for the duration of the next succeeding first time interval. A time-out circuit may also be included to put the latching circuit in its latched mode and to precharge the comparator input and zero the comparator output if there is an excessive lapse of time since the last sensing operation.

DESCRIPTION OF THE PREFERRED EMBODIMENT

Figure 1:
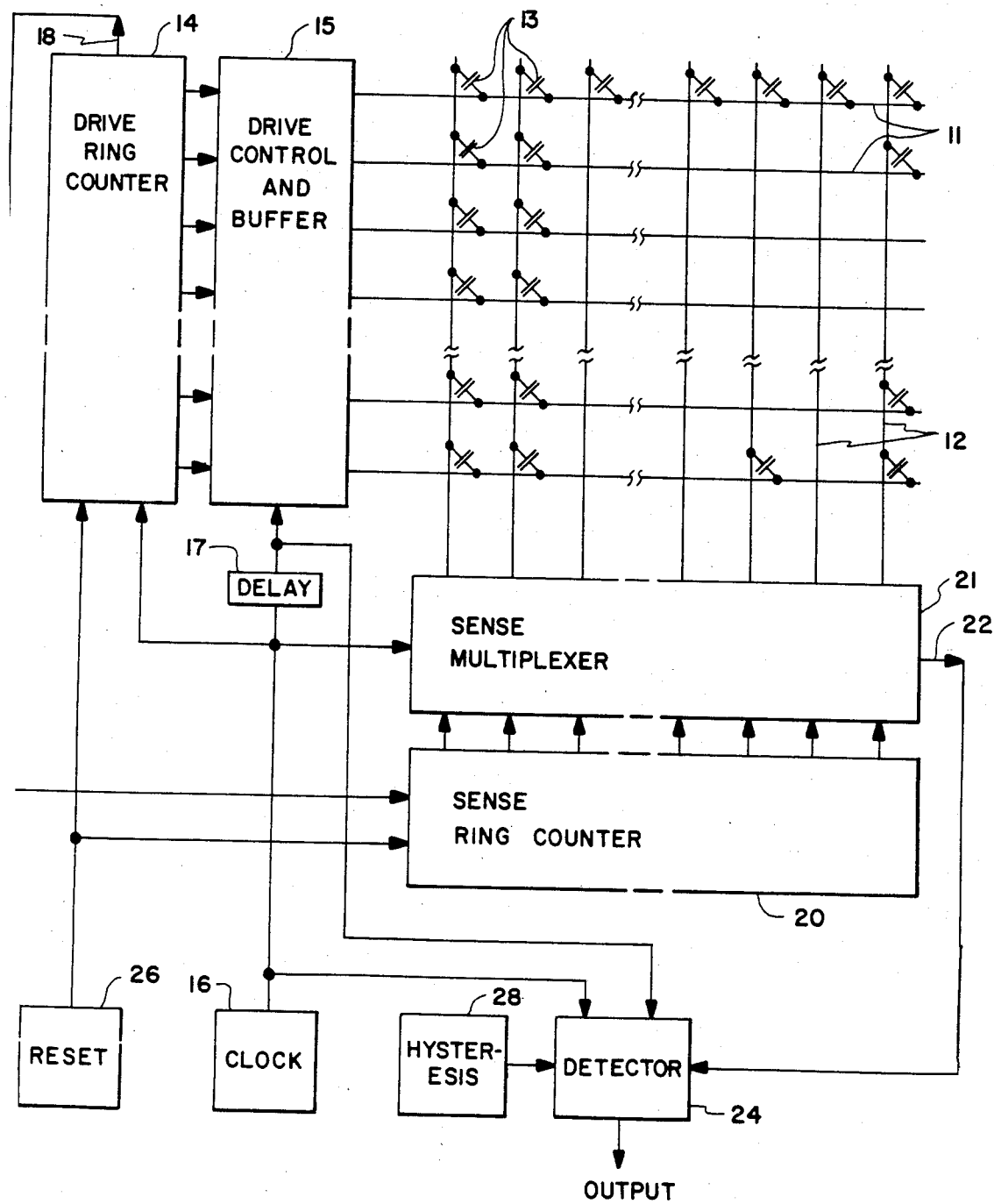
FIG. 1 is a general schematic block diagram of capacitive keyboard apparatus including a detector in accordance with the present invention.

Schematically illustrated in FIG. 1 is a matrix of capacitive keyboard conductors. The matrix includes a first set or plurality of conductors 11 to which drive pulses are supplied and a second set or plurality of conductors 12 on which signals are sensed. Although a particular matrix is shown, the detector apparatus of the present invention may be easily applied to a matrix of any size. Also, although the conductors are represented by sets of parallel, horizontal and vertical lines for illustrative purposes, conductors in an actual keyboard matrix may follow a considerably more complex and irregular pattern.

As illustrated in FIG. 1, a capacitor 13 is located at each crossing of conductors in the first and second sets. Accordingly, the capcitors are shown and may be described as an array of capacitors comprising a plurality of rows and a plurality of columns of capacitors. For purposes of the following description, the terms "rows" and "columns" refer to an idealized electrical layout of a keyboard. The terms are intended to cover a range of physical configurations regardless of whether or not the capacitors are physically arranged in regular columns and rows. Although only a few capacitors are illustrated, it should be understood that, in fact, there is such a capacitor at each crossing of a conductor in one set with a conductor in the other set of conductors.

Capacitors 13 are key actuated variable capacitors, each having a fixed plate and a movable plate, and may be referred to as capacitive switches. One of the plates of each of the capacitors is connected to one of conductors 11. The other plate of each capacitor is connected to one of conductors 12. Accordingly, each capacitor provides variable capacitive coupling between a unique pair of conductors comprising one conductor from each set of conductors. It may also be observed that unless suitable provisions are made there will be stray capacitive coupling to some degree between each conductor and every other conductor in the first and second sets of conductors.

Conductors 11 are sequentially supplied with a drive signal by scanning means including a drive ring counter 14 and a drive control and buffer 15 which will be described in greater detail in connection with FIG. 3. The output terminals of drive control 15 connected to conductors 11 are normally at a logical low state, and are individually driven to a logical high state in sequence under the control of counter 14. Counter 14 as well as various other portions of the apparatus are advanced at a rate determined by a system clock 16. Operation of drive control 15 is delayed slightly from other clock synchronized system operations for purposes which will be discussed hereinafter. The delay is accomplished in part by receipt of clock pulses through delay circuitry 17.

After drive ring counter 14 has advanced through complete scan of drive lines 11, it produces a signal on a terminal 18 which is supplied to a sense ring counter 20. Counter 20 controls a sense multiplexer 21 which sequentially addresses conductors 12 so that the signal on each conductor is transmitted, in turn, through a multiplexer output terminal 22 to a detector 24. As will be described in greater detail hereinafter, sense multiplexer 21 also maintains conductors 12 at the system reference potential except for individual conductors while they are being addressed. Thus, inactive sense conductors 12 are maintained at electrical ground to minimize problems caused by stray capacitive coupling and cross talk.

As is apparent from the foregoing, a complete scan of drive conductors 11 is made while each sense conductor 12 is being addressed, after which the next sense conductor is addressed and another complete scan of drive conductors 11 is made. After this process is completed for all sense conductors so as to individually address each capacitor in the array, a reset signal is supplied to drive counter 14 and sense ring counter 20 by an external system reset arrangement 26 which initiates a new scan cycle.

Reference numeral 24 identifies a detector in accordance with the present invention having a sense terminal connected to output terminal 22 of sense multiplexer 21. Detector 24 also receives undelayed and delayed clock signals from clock 16 and delay device 17 respectively and a hysteresis control signal from an external hysteresis control arrangement 28.

Figure 2:
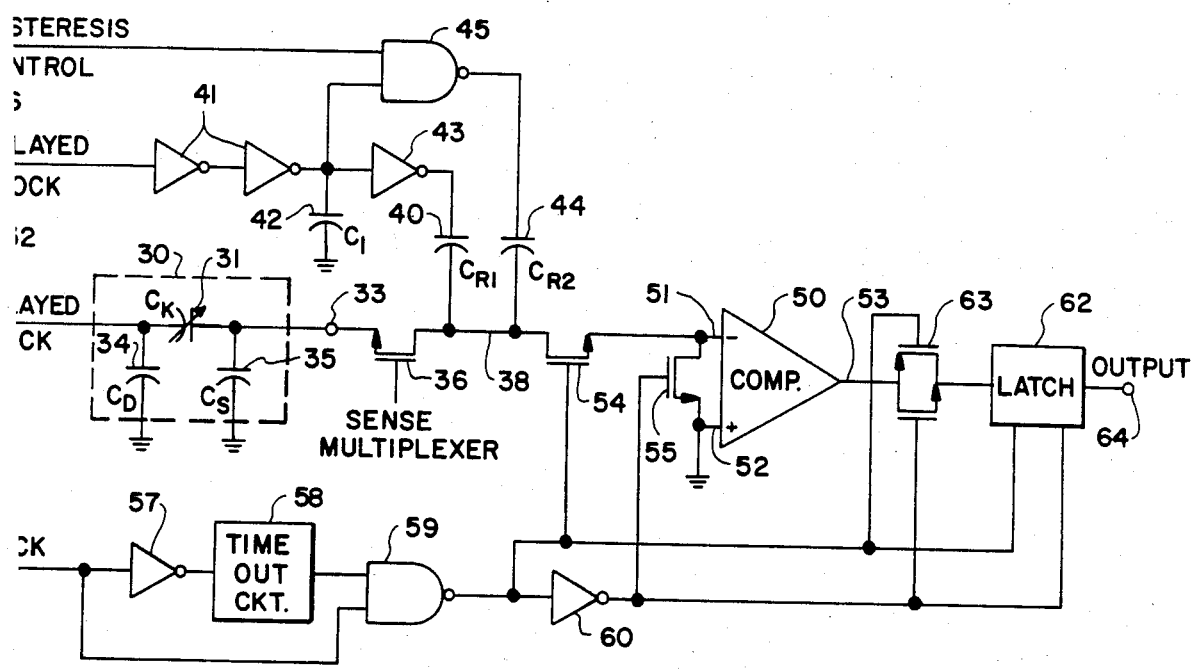
FIG. 2 is a schematic circuit diagram of a preferred embodiment of the detector shown in FIG. 1.

In FIG. 2, the dashed line block identified by reference numeral 30 is the equivalent circuit of one of capacitors 13 and its associated conductors 11 and 12 in FIG. 1. Equivalent circuit 30 includes a variable capacitor 31 which represents one of the capacitive key switches in the keyboard array. Equivalent circuit 30 is shown connected between a source of delayed clock signals 32 and a sense multiplexer input terminal identified by reference numeral 33. The delayed clock signals at source 32 may be provided by system clock 16 and delay circuitry 17 shown in FIG. 1.

A capacitor 34 shown connected between one plate of capacitor 31 and ground represents the effective shunt capacitance between drive conductor 11 to which capacitor 31 is connected and ground. Similarly, a capacitor 35 shown connected between the other plate of capacitor 31 and ground represents the shunt or parasitic capacitance associated with sense conductor 12 to which capacitor 31 is connected. For purposes of the present analysis, the capacitance represented by capacitor 34 can be ignored since it is assumed that the drive circuitry has sufficient output capacity to establish whatever drive voltage is required on drive conductors 11. However, the capacitance represented by capacitor 35 may have a substantial effect on the signals coupled to sense conductors 12 and the operation of detection circuitry for sensing the states of the capacitive key switches.

Reference numeral 36 identifies one of a plurality of switching elements in sense multiplexer 21. A first plate of capacitor 31 is selectively connected through multiplexer input terminal 33 and switching element 36 to a sense node 38 to which a first plate of a reference capacitor 40 is also connected. Reference capacitor 40 has a capacitance between the minimum and maximum capacitances of capacitor 31.

Reference capacitor 40 receives a drive signal which comprises a further delayed and inverted version of the delayed clock signal at delayed clock source 32. The further delay is achieved by a series connected pair of inverters 41 and a capacitor 42. Signal inversion is accomplished by a further inverter 43 whose input terminal is connected to the junction between inverters 41 and capacitor 42. Inverters 41 and capacitor 42 simulate the signal delay inherent in the keyboard capacitive switch array as a result of the capacitances identified in equivalent circuit 30. This provides that voltage changes across sense capacitor 31 and reference capacitor 40 are subject to substantially identical delays to achieve a charge redistribution which accurately represents the relative capacitance values.

Reference numeral 44 identifies an auxiliary reference capacitor which may be selectively connected in parallel with reference capacitor 40. Selective connection is accomplished by providing the drive signal for capacitor 44 from a NAND circuit 45 having a first input terminal connected to the junction between inverters 41 and capacitor 42 and a second input terminal connected to a hysteresis control signal source 46.

Reference numeral 50 identifies a comparator having inverting and noninverting input terminals 51 and 52 respectively and an output terminal 53 at which is produced a signal indicative of whether the voltage at inverting input terminal 51 is smaller or larger than the voltage at noninverting input terminal 52, the latter voltage being system ground. Input terminal 51 is selectively connected to sense node 38 through a switching device 54. Switching device 54 is controlled in response to the clock signal, subject to a constraint that any complete period of the clock signal not exceed a predetermined duration. Input terminal 51 is also selectively connected to system ground through a switching device 55 which is controlled by the clock signal in an out of phase relationship with operation of switching device 54.

The clock signal is supplied by a clock signal source 56 which corresponds to system clock 16 in FIG. 1. The clock signal is supplied through an inverter 57 to a time-out circuit 58 whose output signal is supplied to a first input terminal of a NAND circuit 59. A second input terminal of NAND circuit 59 receives the clock signal directly from source 56. Accordingly, as long as the high phase of the clock signal does not exceed a predetermined duration fixed by time-out circuit 58, the output signal of NAND circuit 59 replicates the clock signal.

The output signal of NAND circuit 59 is supplied directly to the control terminal of switching device 54, and through an inverter 60 to the control terminal of switching device 55. During normal operation, the low phase of the clock causes switching device 55 to conduct, thereby connecting inverting input terminal 51 to system ground, and electrically isolating terminal 51 from sense node 38. As will be apparent from the discussion of FIG. 3, sense node 38 is also connected to system ground during this clock phase through switching devices in sense multiplexer 21. Yet further, during this clock phase the plates of sense capacitor 31 and reference capacitor 40 not connected to sense node 38 are respectively charged to system ground and a drive voltage different from system ground respectively.

Conversely, during the high phase of the clock, input terminal 51 is isolated from system ground and connected to sense node 38 which is also isolated from system ground. At the same time, the drive voltages on the second plates of sense capacitor 31 and reference capacitor 40 are reversed. This results in a charge redistribution on the first plates of the sense and reference capacitors and a change in the voltage on sense node 38 whose polarity depends on whether the capacitance of the sense capacitor is smaller or larger than that of the reference capacitor. The voltage at sense node 38 is compared with a reference voltage (system ground) by comparator 50 which, in turn, produces an output signal indicative of the state of the capacitive key switch then being addressed.

The output signal of comparator 50 is indicative of the state of the capacitive key switch being addressed only during the high phase of the clock. This signal is preserved and transmitted during the next succeeding low phase of the clock by a latching circuit 62 connected to ouput terminal 53 of comparator 50 through a transmission gate 63. During the high phase of the clock signal, gate 63 is operable to connect comparator output terminal 53 to latching circuit 62, which is effectively transparent during that clock phase and replicates the comparator output signal at detector output terminal 64. During the low clock phase, gate 63 isolates latching circuit 62 from comparator output terminal 53, and circuit 62 continues to produce an output signal corresponding to the comparator output signal during the last preceding high clock phase. In the event that the high clock phase exceeds the duration established by time-out circuit 58, latching circuit 62 is provided with the same control signals as during the low clock signal phase, thereby causing it to continue to produce an output signal corresponding to the comparator output signal during the last valid portion of the high clock phase.

Figure 3:
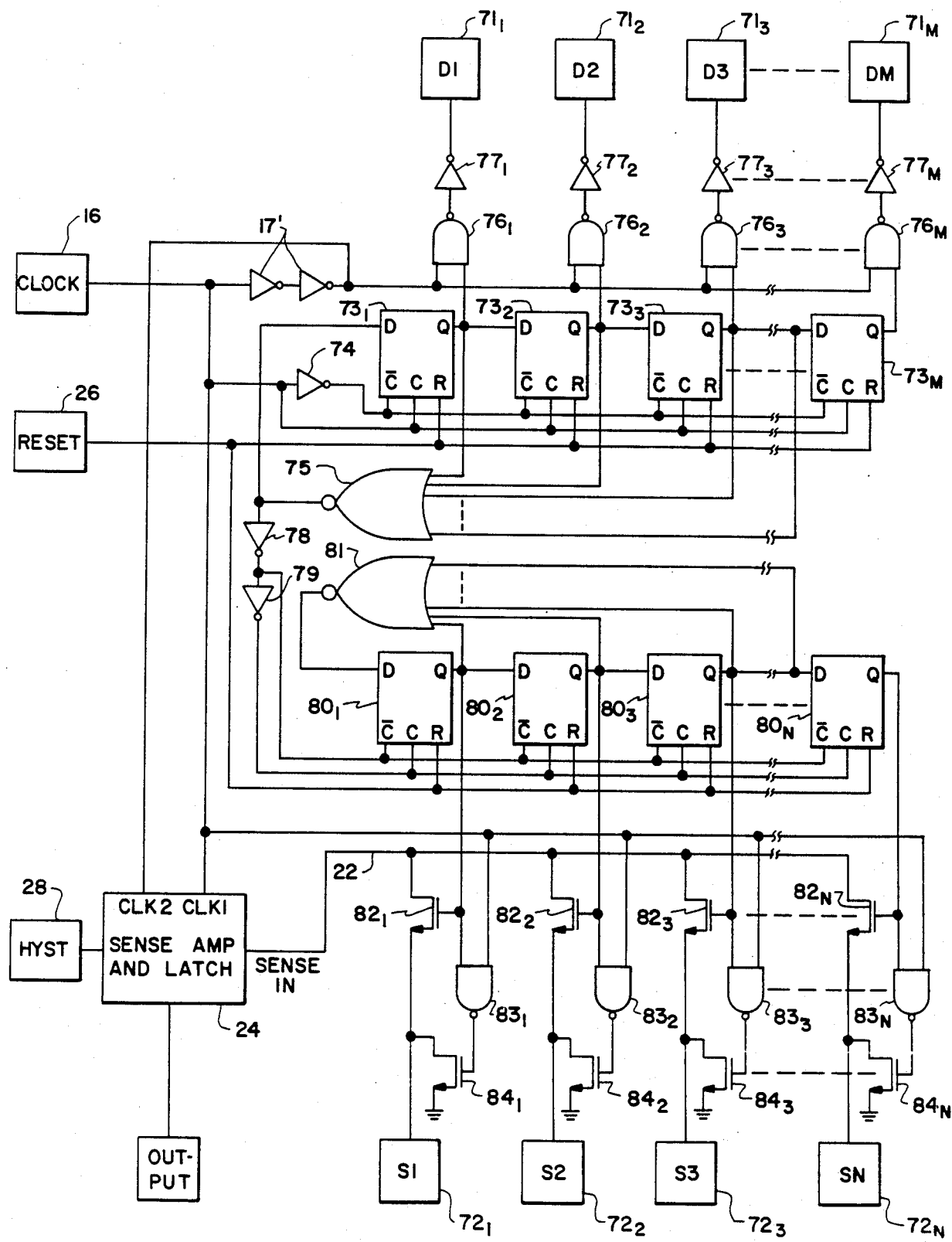
FIG. 3 is a further illustration of the diagram of FIG. 1, including a detailed showing of CMOS circuitry for accomplishing scanning of an array of capacitors in the keyboard apparatus.

The circuit diagram of FIG. 3 is primarily a more detailed version of the block diagram of FIG. 1. Each of blocks $71_1-71_M$ represents one drive conductor 11 and the capacitor plates connected thereto. Similarly, each of blocks $72_1-72_N$ represents one sense conductor 12 and the capacitor plates connected thereto. Drive ring counter 14 of FIG. 1 is formed primarily of a series of interconnected flip-flops circuits $73_1-73_M$. Each flip-flop circuit has clock terminals C and $\overline{C}$ respectively connected to receive the clock signal from system clock 16 and an inverted version of the clock signal from an inverter 74. Each flip-flop circuit also has an R terminal connected to system reset arrangement 26. The Q terminal of each flip-flop circuit except for circuit $73_M$, which is the last circuit in the series, is connected to the D terminal of the next flip-flop circuit in the series. Accordingly, a high state is sequentially produced at the Q terminals of successive flip-flop circuits 73.

The Q terminals of flip-flop circuits 73, except for circuit $73_M$, are connected to the input terminals of a NOR circuit 75 whose output terminal is connected back to the D terminal of flip-flop circuit $73_1$, thus causing flip-flop circuit $73_1$ to produce a high state on its Q terminal in sequence after flip-flop circuit $73_M$.

The Q terminals of flip-flop circuits $73_1-73_M$ are connected to first input terminals of NAND circuits $76_1-76_M$ respectively. Second input terminals of NAND circuit $76_1-76_M$ receive a delayed clock signal from series connected inverters 17'. The output signals of NAND circuits $76_1-76_M$ are supplied through inverters $77_1-77_M$ to drive conductors $71_1-71_M$ respectively. As a result, during successive high phases of the clock signal, drive conductors $71_1-71_M$ sequentially have a drive signal impressed thereon. NAND circuits $76_1-76_m$ and inverters $77_1-77_m$ form drive control and buffer 15 of FIG. 1.

NOR circuit 75 also provides the $\overline{C}$ and C signals for a series of interconnected flip-flops $80_1-80_N$ which partially form sense ring counter 20 in FIG. 1. The $\overline{C}$ signal is supplied through a single inverter 78 and C signal is supplied through inverter 78 and an inverter 79 connected in series therewith. Flip-flop circuits 80 are interconnected in the same manner as flip-flop circuits 73, and further connected in a circuit including a NOR circuit 81 to provide sequential addressing of sense conductors 72.

The construction of sense multiplexer 21 differs from the construction of drive control and buffer 15 as follows. The Q terminals of flip-flop circuits $80_1-80_N$ are connected to the control terminals of switch devices $82_1-82_N$, as well as to first input terminals of NAND circuits $83_1-83_N$ respectively. Second input terminals of NAND circuits $83_1-83_N$ are connected to receive the clock signal from system clock 16. Switch devices $82_1-82_N$ operate to sequentially connect sense conductors 72 to the input terminal of sense amplifier and latch 24 during successive high phases of the clock signal. The output signal of NAND circuits $83_1-83_N$ control switch devices $84_1-84_N$ respectively which maintain sense conductors 72 at ground potential at all other times.

Figure 4:
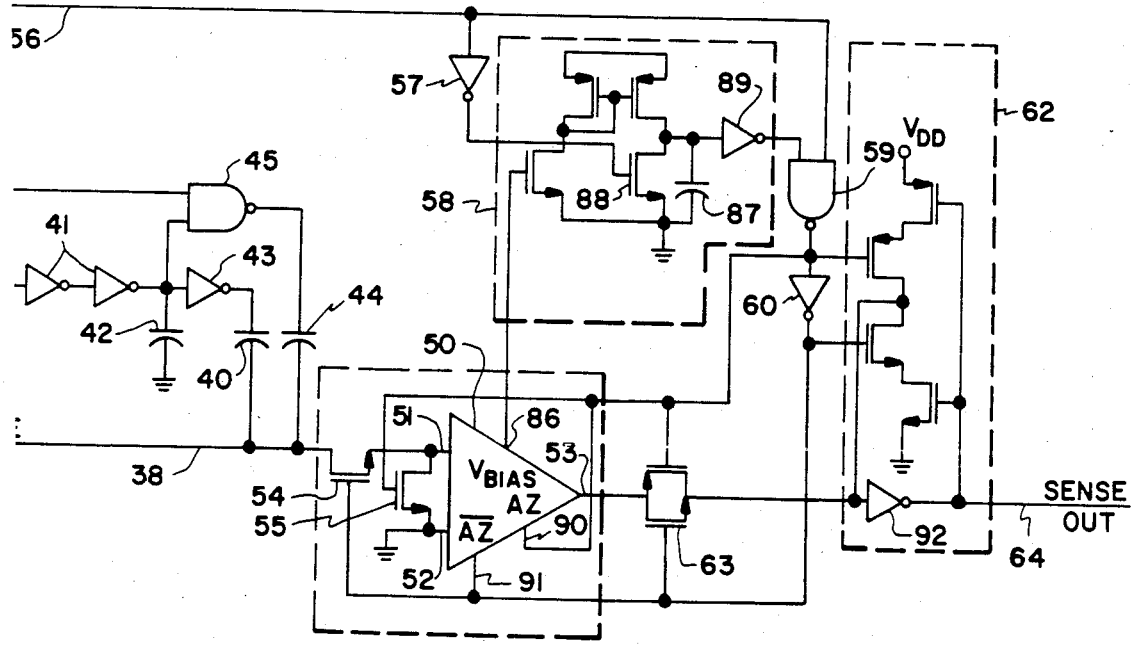
FIG. 4 is a circuit diagram of the sense amplifier and latch circuit shown in block diagram form in FIG. 3.

The circuit diagram of FIG. 4 differs from the diagram of FIG. 2 primarily in that it shows the circuit details of time-out circuit 58 and latching circuit 62. It also shows external connections to comparator 50 for an auto-zeroing or nulling feature. In connection with time-out circuit 58, comparator 50 includes a terminal 86 at which is produced a current used to charge a capacitor 87 in the time-out circuit. A switching device 88 in the time-out circuit is connected across capacitor 87 and is controlled by an inverted clock signal so that during the low phases of the clock there is a short across the capacitor. During the high phases of the clock capacitor 87 is allowed to charge. If the high phase exceeds a predetermined duration determined by the charging current and the capacitance value, the output signal of an inverter 89 in the time-out circuit goes to its low state.

The output signal of inverter 89 and the system clock signal are supplied to NAND circuit 59 whose output terminal is connected to an auto-zeroing terminal 90 of comparator 50, as well as to the control terminal of switching device 55 and to gate 63 and latching circuit 62. The output signal of NAND circuit 59 is also inverted by inverter 60 and supplied to terminal 91 ($\overline{AZ}$) of comparator 50 as well as to the control terminal of switching device 54 an to gate 63 and latching circuit 62.

During the high phases of the clock signal, and provided that a high phase does not exceed a predetermined duration, the control signals supplied to gate 63 by NAND circuit 59 and inverter 60 cause it to conduct, thus permitting latching circuit 62 to produce an inverted version of the comparator output signal as the detector circuit output signal. During the low phases of the clock signal and during any interval that a high phase of the clock signal exceeds the predetermined duration, latching circuit 62 continues to produce the same signal which was being produced during the valid portion of the last preceding high phase of the clock signal.

Figure 5:
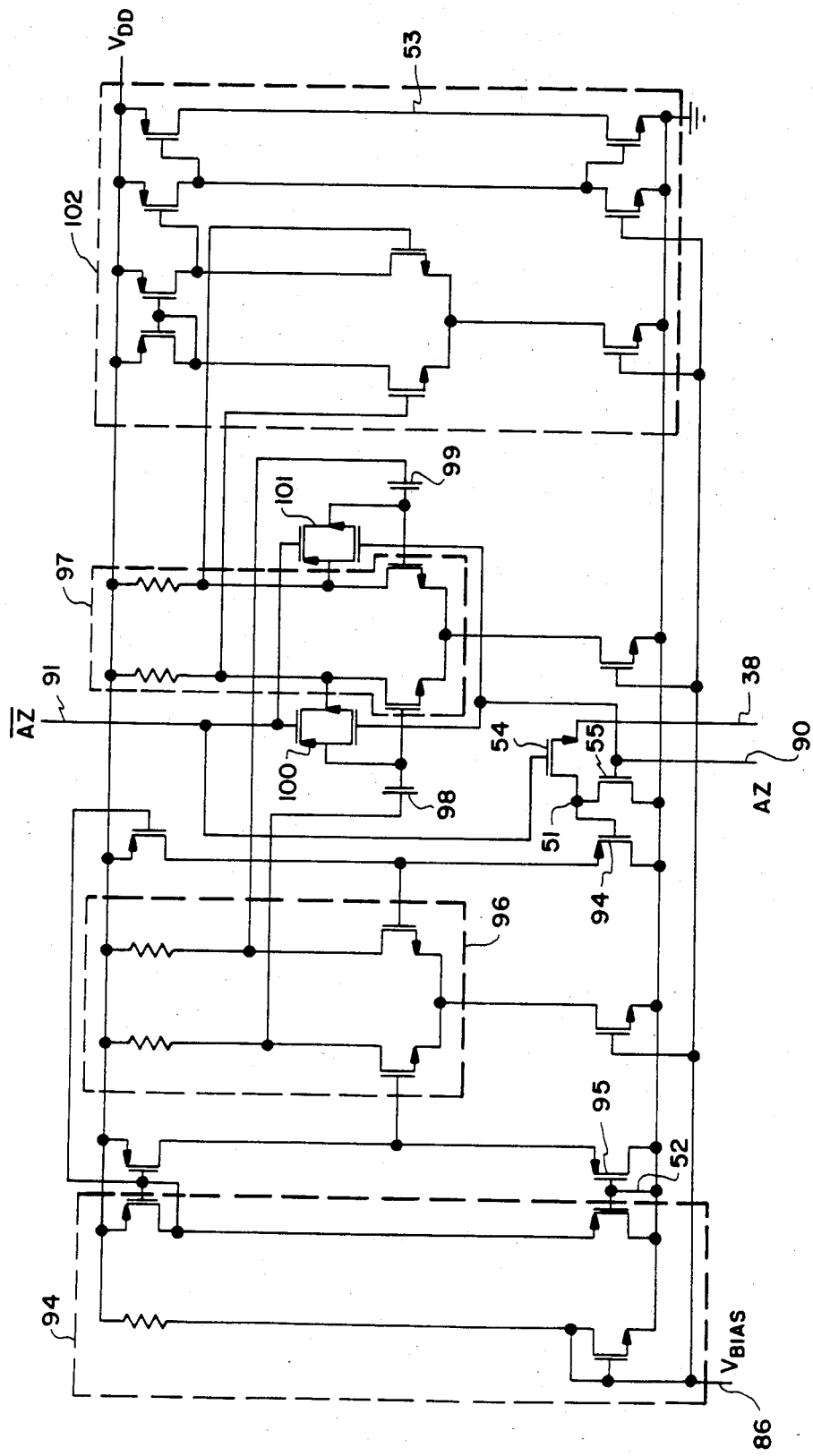
FIG. 5 is a circuit diagram of the comparator shown in the circuit diagram of FIG. 4.

In the comparator circuit diagram of FIG. 5, the inverting and noninverting input terminals of the comparator are identified by reference numerals 51 and 52. The components within dashed line block 94 form the current source which provides current at terminal 86 of the comparator for use by time-out circuit 58. Transistors 94 and 95 form a unity gain input stage to a first differential amplifier comprising the components within dashed line box 96. First differential amplifier 96 is AC coupled to a second similar differential amplifier 97 through coupling capacitors 98 and 99. During the low phases of the clock signal when the comparator is provided with a null input signal, transmission gates 100 and 101 force differential amplifier 97 to produce a null output signal. Specifically, during the low phases of the clock signal, gates 100 and 101 short the output of amplifier 97 to its input.

The output signal of amplifier 97 is supplied to a classic comparator circuit comprising the components within dashed line block 102 which produces the comparator output signal on a conductor which forms output terminal 53.

In accordance with the foregoing description, the applicants' detector circuit effectively compares the voltage on a sense node between sample and reference capacitors to a system reference voltage or ground. This voltage is determined by the capacitance of the sample capacitor relative to the capacitance of the reference capacitor, the sample and reference capacitors being periodically charged in opposite senses. Deviation of the voltage on the sense node from the reference voltage is detected by a comparator which causes a corresponding detection circuit output signal. Since the voltage change at the input terminal of the comparator required for detection is almost negligable, the size of any shunt or parasitic capacitance has substantially no effect on key state detection.

Although a specific embodiment of the applicants' invention has been shown and described for illustrative purposes, a variety of other embodiments and modifications will be apparent to those skilled in the relevant arts. It is not intended that coverage be limited to the embodiments disclosed herein, but only by the terms of the following claims.

The embodiments of the invention in which an exclusive property or right is claimed are defined as follows:

1. A charge redistribution capacitance detector for determining the capacitance of a sample capacitor relative to a predetermined capacitance value, comprising:
   a sense node;
   a reference capacitor having first and second plates and a capacitance equal to the predetermined capacitance value, the first plate of said reference capacitor being connected to said sense node;
   first connecting means adapted to connect a first plate of the sample capacitor to the sense node;
   a source of reference voltage;
   a comparator having an input terminal, and an output terminal at which is produced an output signal indicative of whether the voltage at the input terminal is smaller or larger than the reference voltage;
   signal generating means operable to impress the reference voltage and drive voltage different from the reference voltage on the second plates of said sample and reference capacitors respectively during first time periods, and to impress the drive voltage and the reference voltage on the second plates of said sample and reference capacitors respectively during second time periods which alternate with the first time periods;
   second connecting means connecting the input terminal of said comparator to said sense node; and
   first switching means operable to electrically connect said sense node to said source of reference voltage during the first time periods, and to isolate said sense node from said source of reference voltage during the second time periods.

2. The capacitance detector of claim 1 wherein said second connecting means comprises second switching means operable to electrically connect the input terminal of said comparator to said sense node during the second time periods and to isolate the input terminal of said comparator from the sense node during the first time periods.

3. The capacitance detector of claim 2 including third switching means operable to impress the reference voltage on the input terminal of said comparator during the first time periods.

4. The capacitance detector of claim 3 wherein said comparator includes nulling circuitry operable to adjust said comparator during the first time periods to cause it to produce a null output signal when the reference voltage is impressed on the input terminal of said comparator.

5. The capacitance detector of claim 4 including a latch circuit connected to the output terminal of said comparator, said latch circuit being operable to transmit the comparator output signals during each second time period, and to continue to produce an output signal corresponding to the comparator output signal during the next succeeding first time period.

6. The capacitance detector of claim 5 including a time-out circuit operable to render said second switching means electrically nonconductive, null the output of said comparator and cause said latching circuit to continue to produce the output signal then being produced if a second time period exceeds a predetermined duration.

7. A charge redistribution capacitance detector for determining the capacitance of a sample capacitor relative to a reference capacitance value, comprising:
   a reference capacitor having a capacitance equal to the reference capacitance value, and having first and second plates of which the first plate is adapted to be connected to a first plate of the sample capacitor at a sense node;
   a reference voltage source;
   a clock generator operable to produce a clock signal having first and second states during alternate first and second time intervals respectively;
   voltage supply means responsive to the clock signal for producing first and second electrical signals, the first electrical signal being the reference voltage and a drive voltage different from the reference voltage during the first and second time intervals respectively, the second electrical signal being identical to the first electrical signal, but shifted in time therefrom by substantially the duration of the first time intervals;
   first connecting means for supplying the first and second electrical signals from said voltage supply means to the second plates of said sample and reference capacitors respectively so that, during the first time intervals, the second plates of the sample and reference capacitors are charged to the reference and drive voltages respectively, and during the second time intervals, the second plates of the sample and reference capacitors are charged to the drive and reference voltages respectively;
   first switching means responsive to the clock signal for electrically connecting the sense node to the reference voltage source during the first time intervals and electrically isolating the sense node from the reference voltage source during the second time intervals;

a comparator having an input terminal, and an output terminal at which is produced an output signal indicative of whether the voltage at the input terminal is smaller or larger than the reference voltage; and second switching means responsive to the clock signal for electrically isolating the input terminal of said comparator from the sense node during the first time intervals and electrically connecting the sense node to the input terminal of said comparator during the second time intervals, whereby the output signal of said comparator during the second time intervals is indicative of the capacitance of the sample capacitor relative to the reference capacitance value.

8. Capacitive keyboard apparatus comprising:

an array of capacitive key switches including pluralities of columns and rows of said switches, each switch including a sense capacitor having first and second plates and minimum and maximum capacitance values;

a reference capacitor having a capacitance between the minimum and maximum capacitance values of the sense capacitors;

a reference voltage source;

a clock generator operable to produce a clock signal having first and second states during alternate first and second time periods respectively;

a signal generator responsive to the clock signal and operable to produce first and second electrical signals, the first electrical signal being the reference voltage and a drive voltage different from the reference voltage during the first and second time intervals respectively, the second electrical signal being substantially identical to the first electrical signal, but shifted in time therefrom by substantially the duration of the first time intervals;

first scanning means responsive to the clock signals and operable during the first time intervals to electrically connect the first plates of the sense capacitors and the first plate of said reference capacitor to said reference voltage source during the first time intervals and to sequentially electrically isolate the first plates of columns of the sense capacitors and the first plate of said reference capacitor from said reference voltage source during the second time intervals;

second scanning means responsive to the clock signals for supplying the first and second electrical signals from said signal generator sequentially to the second plates of rows of the sense capacitors and to the second plate of said reference capacitor respectively, whereby, during each first time interval, the second plates of a row of the sense capacitors are charged to the reference voltage and the second plate of the reference capacitor is charged to the drive voltage, and, during each second time interval, the second plates of a row of the sense capacitors are charged to the drive voltage and the second plate of the reference capacitor is charged to the reference voltage;

a comparator having an input terminal, and an output terminal at which is produced a output signal indicative of whether the voltage at the input terminal is smaller or larger than the reference voltage; and first switching means responsive to the clock signal for electrically isolating the input terminal of said comparator from the first plates of the sense and reference capacitors during the first time intervals and electrically connecting the input terminal of said comparator to the first plates of columns of the sense capacitors and the reference capacitor during the second time intervals, whereby said comparator produces an output signal sequentially indicative of the states of the capacitive switches in said array.

9. Capacitive keyboard apparatus comprising:

an array of capacitive key switches, each including a sense capacitor having first and second plates and minimum and maximum capacitance values;

a sense node;

a reference capacitor having first and second plates and a capacitance between the minimum and maximum capacitance values of the sense capacitors, the first plate of said reference capacitor being connected to said sense node;

a source of reference voltage;

a clock generator operable to produce a periodic clock signal having first and second states during alternate first and second time intervals;

scanning means responsive to the clock signal for sequentially addressing the sense capacitors, each sense capacitor being addressed for a period comprising a successive first and second time interval, said scanning means being operable to electrically connect the first plate of said sense capacitor to said source of reference voltage and to said sense node during the first time interval and to electrically isolate the first plate of said sense capacitor from said source of reference voltage during the second time interval, said scanning means further being operable to impress the reference voltage and a drive voltage different from the reference voltage on the second plates of the sense and reference capacitors respectively during the first time interval and to impress the drive voltage and the reference voltage on the second plates of the sense and reference capacitors respectively during the second time interval;

a comparator having an input terminal, and an output terminal at which is produced a signal indicative of whether the voltage at the input terminal is smaller or larger than the reference voltage; and first switching means responsive to the clock signal to electrically isolate the input terminal of said comparator from said sense node during the first time intervals and to electrically connect the input terminal of said comparator to said sense node during the second time intervals.

10. The capacitive keyboard apparatus of claim 9 including second switching means responsive to the clock signal for electrically connecting the input terminal of said comparator to said source of reference voltage during the first time intervals.

11. The capacitive keyboard apparatus of claim 10 wherein said comparator includes nulling circuitry responsive to the clock signal to adjust said comparator during the first time intervals to cause it to produce a null output signal when the input terminal of said comparator is electrically connected to said source of reference potential.

12. The capacitive keyboard apparatus of claim 11 including a latch circuit connected to the output terminal of said comparator, said latch circuit being responsive to the clock signal and operable to transmit the output signal of said comparator during each second time interval and to continue to transmit said output signal during the next succeeding first time interval.

13. The capacitive keyboard apparatus of claim 12 including a time-out circuit operable to cause operation of the nulling circuitry in said comparator and operation of the latch circuit in the event a second time interval exceeds a predetermined duration.

* * * * *